United States Patent [19]

Ha et al.

[11] Patent Number: 6,039,888
[45] Date of Patent: Mar. 21, 2000

[54] METHOD OF ETCHING AN ORGANIC ANTI-REFLECTIVE COATING

[75] Inventors: Jae Hee Ha; Sun Ae Jun, both of Chungcheongbuk-do, Rep. of Korea

[73] Assignee: LG Semicon Co., Ltd., Chungcheongbuk-do, Rep. of Korea

[21] Appl. No.: 08/827,694

[22] Filed: Apr. 10, 1997

[30] Foreign Application Priority Data

Oct. 11, 1996 [KR] Rep. of Korea ................... 96-45258

[51] Int. Cl.[7] ........................................ C23F 1/00

[52] U.S. Cl. ........................... 216/13; 216/41; 216/47; 438/725

[58] Field of Search .................. 216/13, 67, 41, 216/47; 438/725

[56] References Cited

U.S. PATENT DOCUMENTS

| | | |
|---|---|---|
| 5,234,990 | 8/1993 | Flaim et al. . |
| 5,240,554 | 8/1993 | Hori et al. .............................. 156/643 |
| 5,476,816 | 12/1995 | Mautz et al. ........................... 437/195 |
| 5,753,418 | 5/1998 | Tsa et al. ................................ 430/313 |
| 5,773,199 | 6/1998 | Linliu et al. ........................... 430/316 |

*Primary Examiner*—Bruce Breneman
*Assistant Examiner*—Alva C. Powell
*Attorney, Agent, or Firm*—Birch, Stewart, Kolasch & Birch, LLP

[57] ABSTRACT

A method of etching an organic reflective coating which is suitable for minimizing the loss of a photoresist film and for improving the anisotropic etch profile is provided, including the steps of forming an organic anti-reflective coating on an etch layer, coating and patterning a photoresist material on the organic anti-reflective coating, and etching the organic anti-reflective coating in an $O_2/CO$ plasma atmosphere.

4 Claims, 2 Drawing Sheets

METHOD OF ETCHING AN ORGANIC ANTI-REFLECTIVE COATING

BACKGROUND OF THE INVENTION

Field of the Invention

The present invention relates to a method of manufacturing a semiconductor device, and more particularly, to a method of etching an organic anti-reflective coating, which is suitable to minimize the loss of a photoresist film and to improve an anisotropic etch profile.

In general, the use of a bottom organic layer as an anti-reflective coating for i-line and deep microlithography (DUV) is rapidly increasing, recently.

An organic anti-reflective coating (ARC) has an aromatic polysulfone structure which has the following functional units:

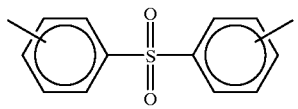

In other words, in case that a component constituting the anti-reflective coating has the above aromatic polysulfone structure), it is used as an available anti-reflective coating for the DUV microlithography.

The organic layer has a carbon (C) of the aromatic radical as a main component, and has another components such as S=O,H. Thus, in order to etch such organic layer, there is utilized an $O_2$ plasma in etching of a down stream type or a plasma type, or in a reactive ion etching (RIE) equipment.

However, due to the chemical reaction characteristics between the bottom organic anti-reflective coating and the $O_2$ plasma, an anisotropic etch profile occurs when etching the organic anti-reflective coating, whereby a serious critical dimension (CD) bias is caused.

Discussion of Related Art

In order to solve the aforementioned problem, a polymer was formed on the sidewall of an organic layer for used as the anti-reflective coating, in the past.

Hereinafter, the conventional method of etching an organic anti-reflective coating will be described with reference to the attached drawings.

FIGS. 1a to 1c are cross-sectional views for illustrating the conventional method of etching an organic anti-reflective coating.

To begin with, as shown in FIG. 1a, an organic anti-reflective coating 2 is formed on an etch layer 1, i.e. a layer to be etched.

A photoresist material 3 is coated on the organic anti-reflective coating 2, and then, patterned through exposure and development processes.

As shown in FIG. 1b, by adding a gas such as $N_2$, $CHF_3$, $CF_4$ or $C_2F_6$, that is, a compound gas containing $N_2$ or F, to an $O_2$ plasma, etching of the down stream type can be carried out. Also, the etching process may be performed in equipment such as the reactive ion etching type (RIE) or the magnetically enhanced reaction ion etching type (MERIE).

At this time, due to the added gas, a polymer 4, such as for example, CNx, CHFx or CFx, is formed at both sides of the organic anti-reflective coating 2 under the photoresist 3.

Further, on the surface of the etch layer 1, on which the organic anti-reflective coating 2 is removed, a residue 5 consisting of CF or CN collects.

Then, as shown in FIG. 1c, the photoresist 3 is removed. Using the organic anti-reflective coating 2 as a mask, the etch layer 1 is selectively removed, thereby completing the processes in accordance with the conventional method.

However, the conventional method of etching an organic anti-reflective coating has the following problems.

First, since a heavy gas such as $CHF_3$, $CF_4$ or $C_2F_6$ is added, the photoresist is damaged due to an increase in the ion sputtering effect within the plasma.

Secondly, due to the damage of the photoresist, the etch selectivity between the photoresist and the organic anti-reflective coating is less than 1:1. Thus, accurate etching cannot be accomplished in the etch layer.

Thirdly, in addition to the sidewall of the organic anti-reflective coating, the polymer such as CHFx or CFx is formed on the etch layer located thereunder, thereby preventing an accurate etching of the etch layer.

SUMMARY OF THE INVENTION

Accordingly, the present invention is directed to a method of etching an organic anti-reflective coating that substantially obviates one or more of the problems due to limitations and disadvantages of the related art.

Accordingly, an object of the present invention is to provide a method of etching an organic anti-reflective coating having an anisotropic etch profile, by adding CO gas to the $O_2$ plasma and utilizing the gas mixture generally at very low substrate temperatures.

Additional features and advantages of the present invention will be set forth in the description which follows. The objectives and other advantages of the present invention will be realized and attained by the structure particularly pointed out in the written description and claims hereof as well as the appended drawings.

To achieve these and other advantages and in accordance with the purpose of the present invention, as embodied and broadly described, there is provided a method of etching an organic anti-reflective coating, comprising the steps of forming an organic anti-reflective coating on an etch layer; coating and patterning a photoresist material on the organic anti-reflective coating; and etching the organic anti-reflective coating in an $O_2$/CO plasma atmosphere.

It is to be understood that both the foregoing general description and the following detailed description are to be considered as exemplary and explanatory and thus are not intended to limit the scope of the invention as claimed.

BRIEF DESCRIPTION OF THE ATTACHED DRAWINGS

The present invention will become more fully understood from the detailed description given hereinbelow and the accompanying drawings which are given by way of illustration only, and thus, are not limitative of the present invention, and wherein:

FIGS. 1a to 1c are cross-sectional views illustrating a conventional method of etching organic, anti-reflective coatings; and FIGS. 2a to 2c are cross-sectional views illustrating a method of etching an organic anti-reflective coating in accordance with the present invention.

DETAILED DESCRIPTION OF PREFERRED EMBODIMENT

Reference will now be made in detail to the preferred embodiments of the present invention, examples of which are illustrated in the accompanying drawings.

Figure 1A:
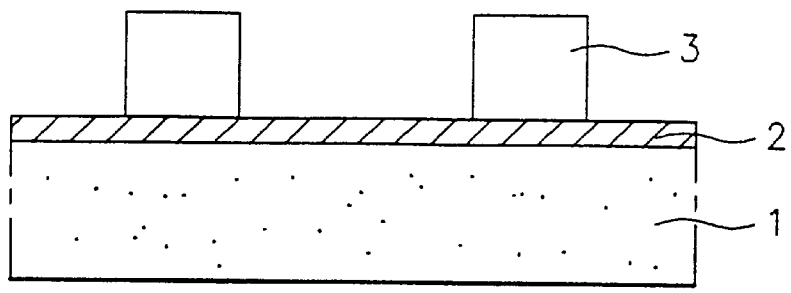
Figure 1B:
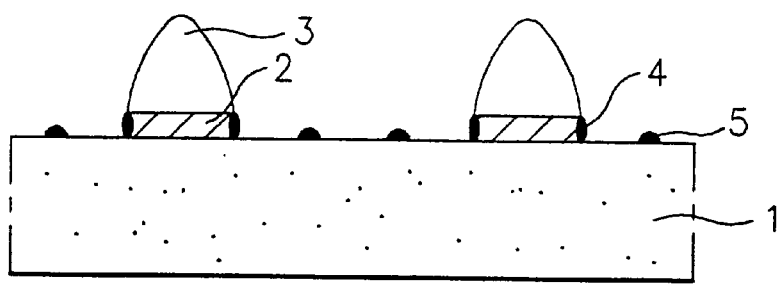
Figure 1C:
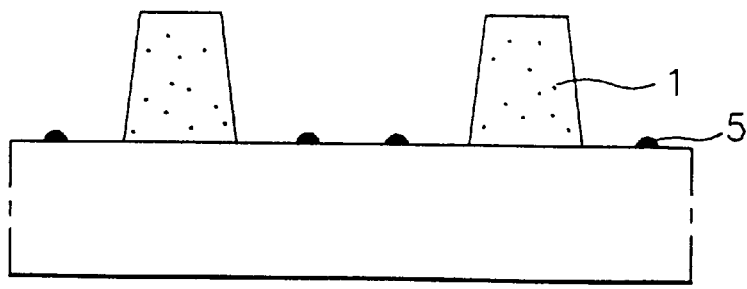
Figure 2A:
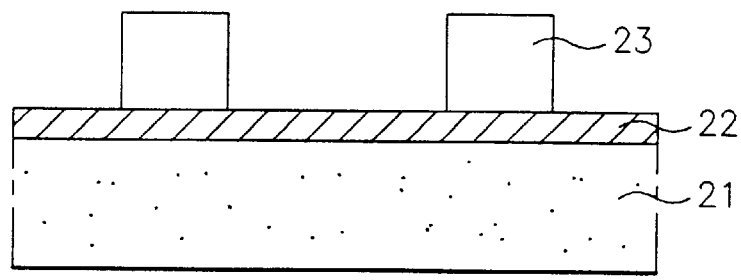
Figure 2B:
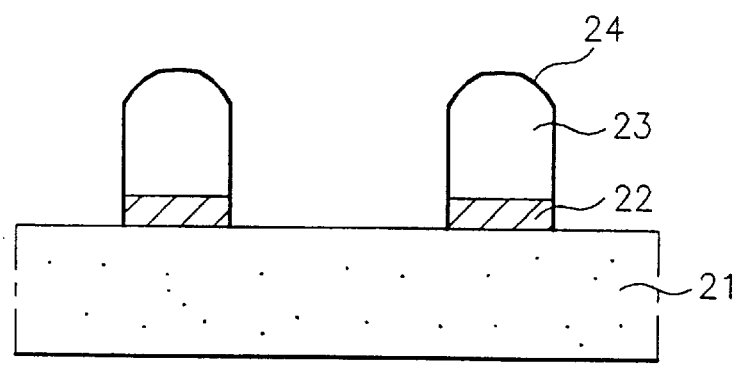
Figure 2C:
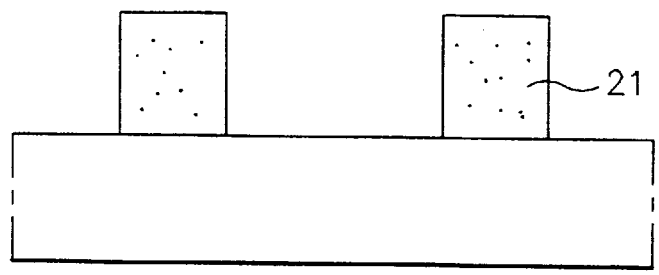

FIGS. 2a to 2c are cross-sectional views illustrating a method of etching an organic anti-reflective coating, in accordance with the present invention.

To begin with, as shown in FIG. 2a, an organic anti-reflective film 22 is formed on an etch layer 21 formed on a semiconductor substrate (not shown).

A photoresist 23 is coated on anti-reflective coating 22 and patterned through exposure and development processes.

Then, as shown in FIG. 2b, the organic, anti-reflective coating 22 is selectively removed in an $O_2$/CO plasma.

At this time, the organic anti-reflective coating 22 and the upper part of the photoresist 23 are etched at the same time. Since the etch rate ratio of the organic anti-reflective coating 22 to the photoresist 23 is 1.5:1, the loss of the upper part of photoresist 23 is minimized when etching the organic anti-reflective coating 22.

Further, since no gas containing F or N is utilized, no residue is formed on the surface of etch layer 21 or at the sides of the organic anti-reflective coating 22.

Further, when etching the organic anti-reflective coating 22 in the $O_2$/CO plasma atmosphere, due to the components $C^Y$ and $CO^Y$ in the $O_2$/CO plasma, a sidewall passivation layer 24 is formed on the surface of the organic anti-reflective coating 22 and the photoresist 23. In the components $C^Y$ and $CO^Y$, "Y" includes all possible plasma states, such as activated states of $C^+$ or $CO^+$, ionized states of $C^+$, $CO^+$, $C^-$, or $CO^-$ or radical states of $C^+$, $CO^-$, etc.

At this time, the equipment used for etching the organic anti-reflective coating 22 is an etching device of the inductively coupled plasma (ICP) type, the reactive ion etching type (RIE), the magnetically enhanced type (MERIE), or the helicon type.

In the case of using etching equipment of the ICP type, the flow ratio of $O_2$ to CO may be 1:1. The $O_2$/CO plasma is generated with a bias power within the range of 400±50W and a source power of 200±500W.

Further, the $O_2$/CO plasma is generated at a pressure within the chamber of 5±2 mT (milli Torr or $10^{-3}$ Torr). Under such conditions, etching the organic anti-reflective coating can be performed within 15 seconds.

Further, with the etching of the organic anti-reflective coating, the substrate temperature is maintained below −10° C., e.g. −10° C. to −40° C. It is desirable to provide a low substrate temperature because if the substrate temperature is high, an oxygen radical with no directionality requires an activation energy that acts only at more than a critical temperature.

Due to this reason, the substrate temperature should be decreased, which results in a large deterioration in the activity of the radical.

Accordingly, since the etching of the organic anti-reflective coating is mainly controlled by an oxygen ion having directionality, the anisotropic profile can be obtained by controlling the bias power.

Meanwhile, in the case of using etching equipment of the helicon type, the bias power is used within the range of 300±500W, and the source power is used within the range of 2000±3000W.

The pressure in the chamber is maintained at a pressure of 5±2 mT, in the same way as that in the case of using etching equipment of the ICP type.

Then, as shown in FIG. 2c, using photoresist 24 left on the patterned organic anti-reflective coating 22 and the organic anti-reflective coating 22 as a mask, etch layer 21 formed on the substrate is etched. Then, photoresist 23 and organic anti-reflective coating 22 are removed at the same time.

As described above, the method of etching an organic anti-reflective coating in accordance with the present invention has the following effects.

First, since the loss of the upper part of the photoresist is small, the anisotropic profile is maintained when removing the etch layer. Thus, an accurate pattern of the etch layer is possible.

Secondly, the effect of the sidewall formed on both sides of the organic anti-reflective coating is excellent. Thus, it is easy to control the CD.

Thirdly, after etching the organic anti-reflective coating, no reside exists on the surface of the etch layer or along the sides of the etched anti-reflective layer.

Accordingly, a process of removing the residue is not required, whereby the total process time can be reduced.

It will be apparent to those skilled in the art that various modifications and variations can be made in the present invention without departing from the spirit and scope thereof. Thus, it is intended that the present invention cover the modifications, variations and equivalents of the present invention that fall within the scope of the appended claims.

What is claimed is:

1. A method of etching an organic anti-reflective coating which comprises:

forming an organic anti-reflective film on an etch layer formed on a semiconductor substrate;

coating a photoresist on the anti-reflective coating;

patterning the photoresist through exposure and development processes;

selectively removing the organic anti-reflective coating in a plasma environment free of N and F;

simultaneously etching the organic anti-reflective coating and the upper part of the photoresist; and using the photoresist left on the patterned organic anti-reflective coating and the organic anti-reflective coating as a mask, the etch layer formed on the substrate is etched with the photoresist and the organic anti-reflective coating being removed at the same time.

2. The method of claim 1, wherein, when etching the organic anti-reflective coating, the substrate temperature is maintained below −10° C.

3. The method of claim 1, wherein the etch, rate ratio of the organic anti-reflective coating to the photoresist is 1.5:1.0.

4. The method of claim 1, wherein the plasma environment is $O_2$/CO.

* * * * *